US009331703B1

(12) United States Patent
Cheung

(10) Patent No.: US 9,331,703 B1
(45) Date of Patent: May 3, 2016

(54) SAMPLE RATE CONVERTER

(71) Applicant: Altera Corporation, San Jose, CA (US)

(72) Inventor: Colman C. Cheung, San Diego, CA (US)

(73) Assignee: Altera Corporation, San Jose, CA (US)

( * ) Notice: Subject to any disclaimer, the term of this patent is extended or adjusted under 35 U.S.C. 154(b) by 8 days.

(21) Appl. No.: 14/482,998

(22) Filed: Sep. 10, 2014

(51) Int. Cl.
*H03L 7/06* (2006.01)
*H03L 7/091* (2006.01)
*H03L 7/18* (2006.01)

(52) U.S. Cl.
CPC .............. *H03L 7/091* (2013.01); *H03L 7/1806* (2013.01); *H03L 2207/50* (2013.01)

(58) Field of Classification Search
CPC .................... H04N 21/4305; H04N 21/23608; H04N 21/4344; H03L 7/0812; H03L 7/07
See application file for complete search history.

(56) References Cited

U.S. PATENT DOCUMENTS 5,842,001 A * 11/1998 Kubota .................. G01R 31/30 713/400
2008/0273635 A1* 11/2008 Neuhaus ............. H04L 27/0014 375/344

OTHER PUBLICATIONS

Altera Corporation 2008. "The Quest for Digital Broadcast Quality: Addressing Quality Hot Spots," WP-01022 ver. 1.2, pp. 1-7.
AR# 52889. "LogiCORE IP Asynchronous Sample Rate Converter (ASRC)—Why do I see jitter when the inout and output are the same sample rate using the automatic mode, but not for manual mode?" Xilinx http://www.xilinx.com/support/answers/52889.htm.
LogiCORE "Asynchronous Sample Rate Converter (ASRC)" Xilinx http://www.xilinx.com/products/intellectual-property/ASRC.htm.
LogiCORE IP 2013. "Asynchronous Sample Rate Converter v2.0," Product Guide for Vivado Design Suite pp. 1-59.

* cited by examiner

*Primary Examiner* — Sibin Chen
(74) *Attorney, Agent, or Firm* — Weaver Austin Villeneuve & Sampson LLP

(57) ABSTRACT

Techniques and mechanisms implement a sample rate converter for resampling data, such as audio data. The resampling may be based on a resampling clock. As the frequency of the resampling clock varies (e.g., due to jitter, rate adjustment, etc.), a control loop feedback mechanism can detect the variations and gradually correct the sampling rate of the resampled data.

19 Claims, 6 Drawing Sheets

SAMPLE RATE CONVERTER

TECHNICAL FIELD

This disclosure generally relates to integrated circuits. More specifically, the disclosure relates to systems and methods for resampling data, such as audio data.

DESCRIPTION OF THE RELATED TECHNOLOGY

Some signals, such as audio data, may need to be converted from one sampling rate to another sampling rate. For example, a 44.1 kilohertz (kHz) frequency audio signal from one system may need to be converted to a 48 kHz frequency audio signal to work within another system. The conversion may be based on a sampling rate clock.

In some systems, the resampling from one sampling rate to another sampling rate may use a "master mode" resampling system. In a master mode resampling system, the sampling rate clock used to convert the audio signal may be generated by the master mode resampling system itself.

By contrast, in a "slave mode" resampling system, the sampling rate clock may be provided by another system, and therefore, not generated by the slave mode resampling system. When received by the slave mode resampling system, the sampling rate clock may have deviations from time-to-time due to effects such as jitter. For example, a sampling rate clock provided to the slave mode resampling system may vary from 48 kHz to 47.999 kHz.

Accordingly, a designer may wish to change the sampling rate based on deviations of the sampling rate clock.

SUMMARY

The subject matter described herein provides a technique to vary the sampling rate of resampled audio based on jitter and rate adjustments of a resampling clock.

In some scenarios, an audio signal may be resampled based on a resampling clock to provide a resampled audio signal. However, jitter on the resampling clock can cause the frequency of the resampling clock to vary. Additionally, the resampling clock used to resample the audio signal into the resampled audio signal may have its rate purposefully adjusted (i.e., its frequency slightly changed) due to a video frame being dropped or added.

In one implementation described herein, an audio sample rate conversion unit may include a control loop feedback mechanism to detect and gradually correct deviations due to effects such as jitter and rate adjustment.

These and other features will be presented in more detail in the following specification and the accompanying figures, which illustrate by way of example.

DETAILED DESCRIPTION OF PARTICULAR EMBODIMENTS

Data, such as an audio signal, may be resampled to convert the data to another sampling rate. For example, one system may provide an audio signal at one sampling rate to a second system. However, the second system may need to convert the audio signal to another sampling rate. As an example, an audio CD may provide an audio signal at 44.1 kiloHertz (kHz). The 44.1 kHz audio signal from the CD may be provided to a system within a digital broadcast infrastructure requiring a 48 kHz signal. Accordingly, the 44.1 kHz audio signal from the CD may be resampled to a 48 kHz signal.

In some implementations, the resampling from one sampling rate to another sampling rate may use a "master mode" resampling system. In a master mode resampling system, the sampling rate clock used to convert the audio signal may be generated by the master mode resampling system itself. For example, if the system within the digital broadcast infrastructure receives the 44.1 kHz audio CD signal, the system may use its own internally generated 48 kHz signal to resample the 44.1 kHz audio CD signal to a 48 kHz signal. The resampled 48 kHz signal may then be used within the digital broadcast infrastructure.

Figure 1:
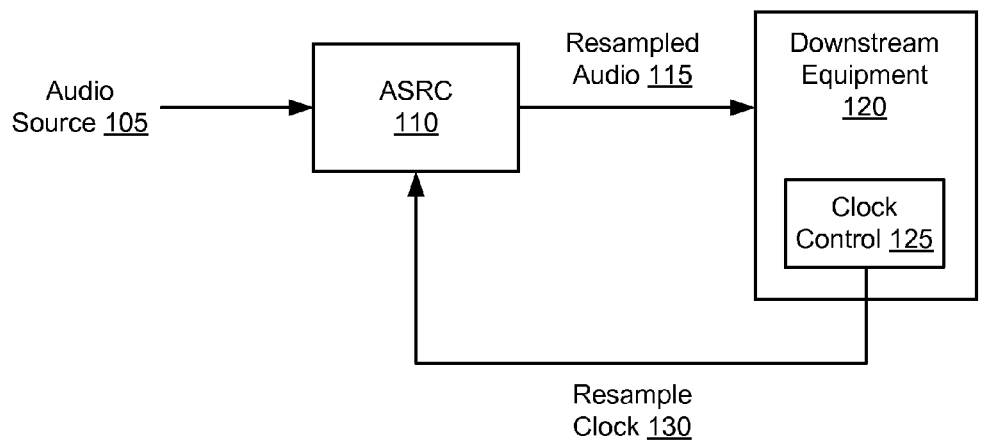
FIG. 1 illustrates an example of a slave mode resampling system in accordance with some implementations.

By contrast, in a "slave mode" resampling system, the sampling rate clock may be provided by another system rather than internally generated by the system receiving the audio CD signal. FIG. 1 illustrates an example of a slave mode resampling system in accordance with some implementations.

In FIG. 1, audio source 105 (e.g., a 44.1 kHz audio CD signal in the previous example) may be provided to an audio sample rate conversion (ASRC) unit 210. ASRC unit 110 may provide resampled audio 115 based on audio source 105 and resample clock 130. In the slave mode resampling system of FIG. 1, resample clock 130 may be provided by downstream equipment 120 (e.g., another system in the digital broadcast infrastructure) rather than internally generated by ASRC unit 110. For example, clock control 125 in downstream equipment 120 may provide resample clock 130. ASRC unit 110 may receive resample clock 130 and generate resampled audio 115 based on resample block 130 and audio source 105. That is, audio source 105 is resampled into resampled audio 115 which has a sampling rate corresponding to resample block 130.

For example, resampled audio 115 may have a sampling rate provided by resample clock 130. If resample clock has a 48 kHz sampling rate, then audio source 105 may be resampled and provided as resampled audio 115 at a 48 kHz sampling rate. Accordingly, ASRC unit 110 may resample audio source 105 and provide resampled audio 115 with a sampling rate corresponding to the sampling rate of resample clock 130.

However, resample clock 130 provided to ASRC unit 110 may have deviations from time-to-time due to effects such as jitter. For example, resample clock 130 may vary from 48 kHz to 47.999 kHz to 48.001 kHz back to 48 kHz, and so on. The deviations may accumulate errors and result in degradation of resampled audio 115. Additionally, "rate adjustment" may be performed when equipment speeds up or slows down resample clock 130. For example, resample clock 130 may be purposefully adjusted if video frames are added or dropped, leading to the audio resampling needing to be adjusted.

Accordingly, the sampling rate of resampled audio 115 may need to vary based on the deviations of resample clock 130 to reduce accumulated errors due to effects such as rate adjustment. Additionally, changing the sampling rate of resampled audio 115 to match that of resample clock 130 may be gradual rather than sudden to reduce the likelihood of audio resampling rate changes being noticeable.

Figure 2:
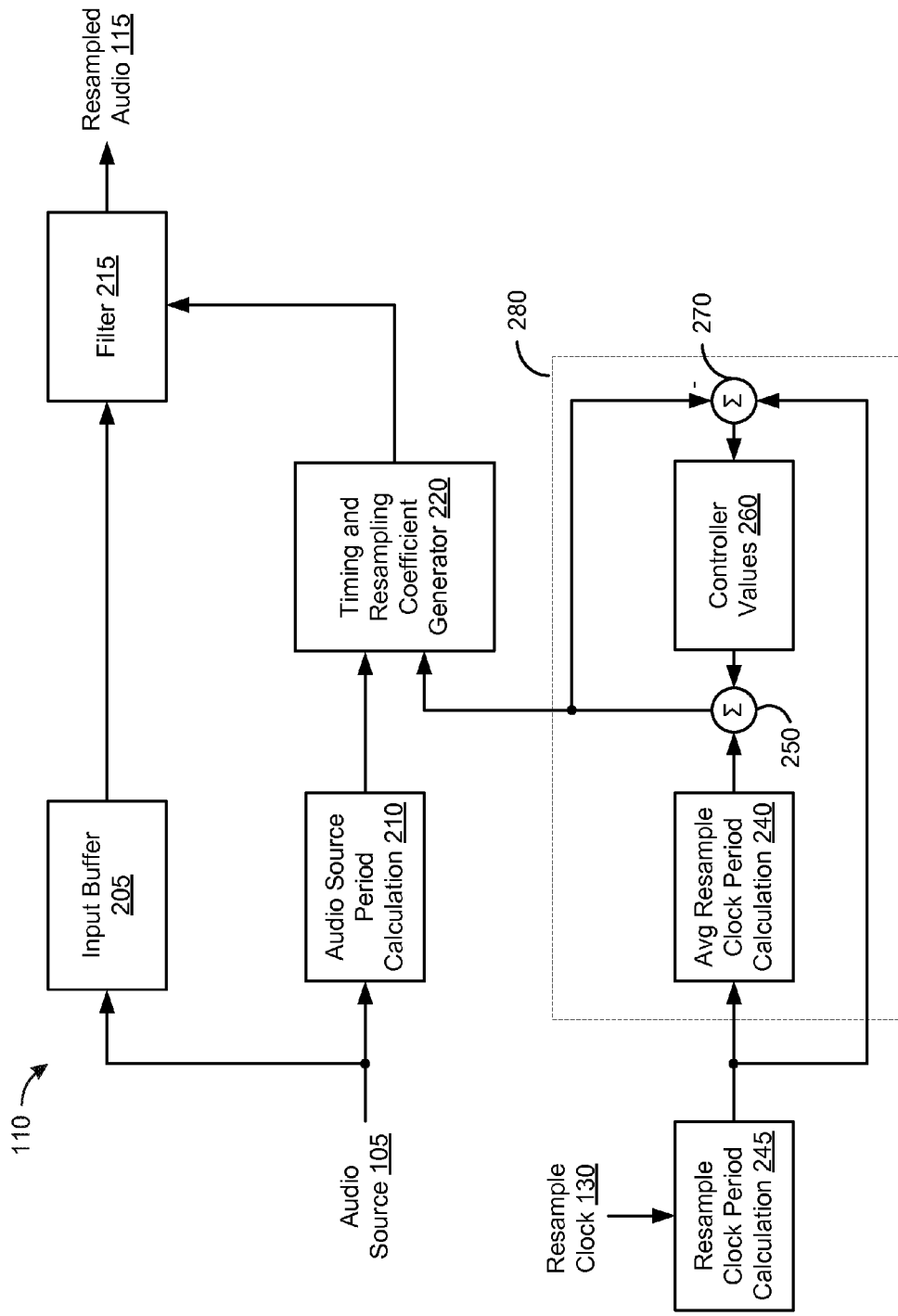
FIG. 2 illustrates a simplified example of an audio sample rate conversion (ASRC) of the slave mode resampling system of FIG. 1 in accordance with some implementations.

FIG. 2 illustrates a simplified example of an audio sample rate conversion (ASRC) of the slave mode resampling system of FIG. 1 in accordance with some implementations. In FIG. 2, the ASRC may detect and gradually correct deviations due to effects such as jitter and rate adjustment.

Resampled audio 115 may be provided by filter 215 (e.g., a finite impulse response (FIR) filter). Filter 215 may use data such as coefficients provided by timing and resampling coefficient generator 220 in order to provide resampled audio 115. Timing and sampling coefficient generator 220 may generate data such as the coefficients used by filter 215 based on periods corresponding to audio source 105 and resample clock 130 in order to accommodate the sampling rate of resample clock 130.

The period of audio source 105 may be measured, or determined, by audio source period calculation 210. The calculated period of audio source 105 may then be provided to resampling coefficient generator 220.

However, rather than the period of resample clock 130 being provided to timing and resampling coefficient generator 220, an adjusted average period of resample clock 130 (provided by period adjustment 250) may be provided to timing and resampling coefficient generator 220. The adjusted average period of resample clock 130 may be based on an average period of multiple period measurements of resample clock 130 with a slight adjustment based on the difference between a prior adjusted average period of resample clock 130 and the current period of resample clock 130. As the current period of resample clock 130 changes (e.g., due to jitter), resample clock control 280 may gradually change the adjusted average period of resample clock 130 by generating a set of adjustment values to add to the average period of the multiple period measurements of resample clock 130. New sets of adjustment values may be provided until the adjusted average period of resample clock 130 matches the period of resample clock 130.

Accordingly, providing the adjusted average period of resample clock 130 to timing and resampling coefficient generator 220 may influence the generated filter coefficients used by filter 215 to provide resampled audio 115. Providing the adjusted average period of resample clock 130 rather than the current period of resample clock 130 may provide a more gradual change in resampled audio 115, and therefore, provide a less noticeable change in the sampling rate.

Figure 3:
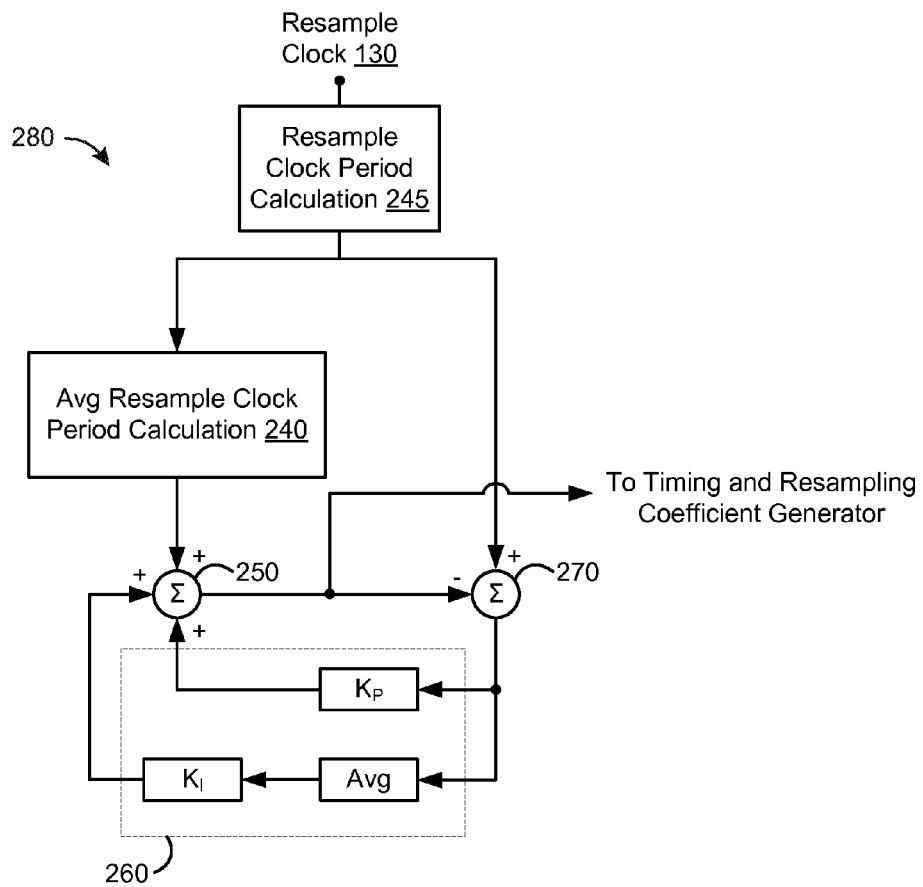
FIG. 3 illustrates an example of a controller portion of the ASRC of FIG. 2 in accordance with some implementations.

FIG. 3 illustrates an example of a resample clock control 280 of the ASRC of FIG. 2 in accordance with some implementations. Resample clock control 280 provides functionality to quickly respond to deviations (e.g., due to jitter) of resample clock 130 such that accumulated errors may be reduced. Additionally, resample clock control 280 provides functionality to gradually change the adjusted average period of resample clock 130 as the period of resample clock 130 experiences deviations. As previously discussed, gradual changes may lead to less noticeable changes in the sampling rate of audio 115.

In FIG. 3, resample clock control 280 includes several components: average resample clock period calculation 240, resample clock period calculation 245, period adjustment 250, period difference 270, and controller values 260. The components implement a PI controller providing a control loop feedback mechanism for generating the adjusted average period of resample clock 130 that is used by timing and resampling coefficient generator 220 and ultimately used to adjust the sampling rate of resampled audio 115. However, any variation of a controller may be implemented (e.g., a PI, PID, etc. controller).

Resample clock period calculation 245 may receive resample clock 130 and determine the period of resample clock 130.

Average resample clock period calculation 240 may calculate a real-time average period of resample clock 130. In some implementations, resample clock period calculation 240 may calculate an average period based on the current, or real-time, period of resample clock 130 provided by resample clock period calculation 245 and a large number of prior clock period determinations, or measurements, of resample clock 130. For example, average resample clock period calculation 240 may determine the average period of resample clock 130 based on $2^{14}$ (i.e., 16,384) measurements of the period of resample clock 130, including the current, real-time, period of resample clock 130 as provided by resample clock period calculation 245.

Period adjustment 250 may receive inputs from average resample clock period calculation 240 (i.e., the average period of resample clock 130) and controller values 260 (i.e., adjustment values, as discussed below.). Period adjustment 250 may generate an adjusted average period of resample clock 130 by summing the average period of resample clock 130 provided by average resample clock period calculation 240 with adjustment values generated by controller values 260. In some implementations, multiple sets of adjustment values (e.g., from several "loops" through resample clock control 280) may be summed with the adjusted average period of resample clock 130.

Period difference 270 may receive the adjusted average period of resample clock 130 (from period adjustment 250) and the period of resample clock 130 (from resample clock period calculation 245) as inputs and determine a difference in the periods of the two inputs. That is, period difference 270 may determine the difference between the periods of resample clock 130 and the adjusted average period of resample clock 130.

Period difference 270 may provide the difference between the period of resample clock 130 and the adjusted average period of resample clock 130 to controller values 260. In FIG. 3, controller values 260 may generate two adjustment values to be summed with the average period of resample clock 130 by period adjustment 250 to determine the adjusted average period of resample clock 130, as previously discussed. In particular, $K_P$ may provide a proportional value and $K_I$ may provide an integral value (based on an average of the current period difference and prior period differences) similar to a proportional-integral (PI) controller, as is understood by those of ordinary skill in the art. In particular, $K_P$ and $K_I$ may generate adjustment values representing corrections to the adjusted average period of resample clock 130 based on the difference between the periods of resample clock 130 and adjusted average period of resample clock 130 as determined by period difference 270. $K_P$ may generate a smaller adjustment value than $K_I$ (e.g., $K_P$ may provide a value that is half of $K_I$). Additionally, $K_I$ may be based on an average of differences in periods of resample clock 130 and the adjusted average period of resample clock 130 (e.g., an average of the 32 most recent differences in periods). The adjustment values generated by controller values 260 may not represent a full correction (i.e., the difference between the period of resample clock 130 and the adjusted average period of resample clock 130), but a percentage of the difference (e.g., 20%) to allow for a gradual matching of the period of resample clock 130.

As an example, period difference 270 may determine that the period of resample clock 130 (provided by resample clock period calculation 245) is 2 nanoseconds (ns) more than the adjusted average period of resample clock 130 (provided by period adjustment 250). Controller values 260 may receive data indicating the 2 ns difference and generate two adjustment values: a 0.2 ns correction provided by $K_I$ and a 0.1 ns correction provided by $K_P$. That is, the two adjustment values indicate an adjustment, or correction, of 0.3 ns. Data indicating the 0.3 ns adjustment may be provided to period adjustment 250. Accordingly, the adjusted average period of resample clock 130 provided by period adjustment 250 may be the average period of resample clock 130 summed with a 0.3 ns adjustment. The adjusted average period of resample clock 130 is provided to period difference 270. If the period of resample clock 130 has not changed, then a 1.7 ns difference between resample clock 130 and the adjusted average period of resample clock 130 may be determined by period difference 270. The 1.7 ns difference is provided to controller values 260 and new adjustment values may be generated indicating another adjustment or correction such that the difference in periods between the adjusted average period of resample clock 130 and the period of resample clock 130 decreases again. For example, the adjustment values may indicate an adjustment of 0.15 ns, and therefore, the adjusted average period of resample clock 130 may increase by 0.15 ns (i.e., the 0.15 ns adjustment is summed with the prior 0.3 ns adjustment providing an adjustment of 0.45 ns, which is summed with the average period of resample clock 130 provided by average resample clock period calculation 240). Period difference 270 may determine the difference between the adjusted average period of resample clock 130 and the period of resample clock 130 to be 1.55 ns and provide data indicating the difference to controller values 260.

Accordingly, the loop of resample clock control 280 continues and the adjusted average period of resample clock 130 is gradually changed (based on the correction values from controller values 260) so that it matches the period of resample clock 130. If the period of resample clock 130 changes (e.g., due to jitter), a difference in period between resample clock 130 and the adjusted average period of resample clock 130 may be detected and the process may repeat again to gradually adjust the adjusted average period of resample clock 130 to match the period of resample clock 130.

Figure 4:
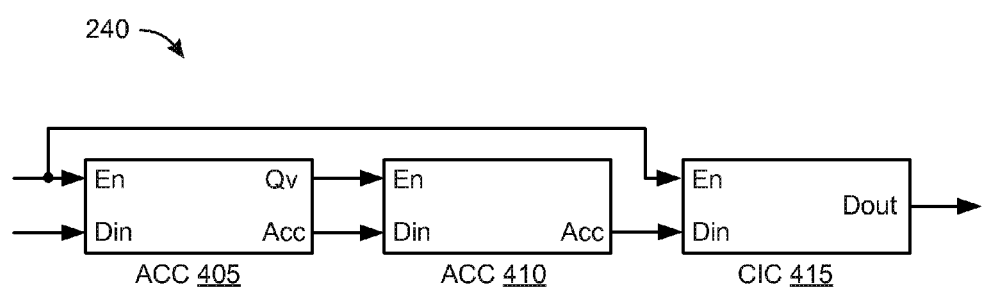
FIG. 4 illustrates an example of a resample clock averaging calculation unit in accordance with some implementations.

FIG. 4 illustrates an example of average resampling clock period calculation 240 in accordance with some implementations. Average resampling clock period calculation 240 may provide a fast and efficient averaging of resample clock period 130 that allows for resample clock control 280 to quickly respond to changes in the period of resample clock 130, as previously discussed. For example, average resampling clock period calculation 240 may provide an average of $2^{14}$ (i.e., 16,384) measurements of the period of resample clock 130.

In FIG. 4, average resampling clock period calculations includes accumulator 405, accumulator 410, and cascaded integrator-comb filter (CIC) 415. Accumulator 405 may provide data to accumulator 410. Accumulator 410 may provide data to CIC 415. The output of CIC 415 may be the average period of resample clock 130. CIC 415 may provide a "smoothing" effect to the averages determined by accumulator 410. However, in other implementations, CIC 415 may be removed and the output of accumulator 410 may be provided as the average period of resample clock 130.

In the example of FIG. 4, accumulator 405 and CIC 415 may receive an enable signal to begin operation (e.g., to begin the process to provide the average period of resample clock 130). Accumulator 405 may receive and store data indicating the period of resample clock 130 (e.g., from resample clock period calculation 245). After receiving 32 measurements of the period of resample clock 130, accumulator 405 may determine an average of the 32 measurements. Accumulator 405 may then generate an enable signal (provided by output Qv of accumulator 405) indicating that the output (provided by output Acc of accumulator 405) provides the average of the 32 measurements. Accumulator 410 may receive the enable signal and store the average of the 32 measurements. When accumulator 410 receives 512 averages of 32 measurements each, accumulator 410 may then determine an average of the 512 measurements and provide data indicating the average period of resample clock 130 to CIC 415. Accordingly, an average based on $2^{14}$ (i.e., 16,384) measurements may be determined.

Figure 5:
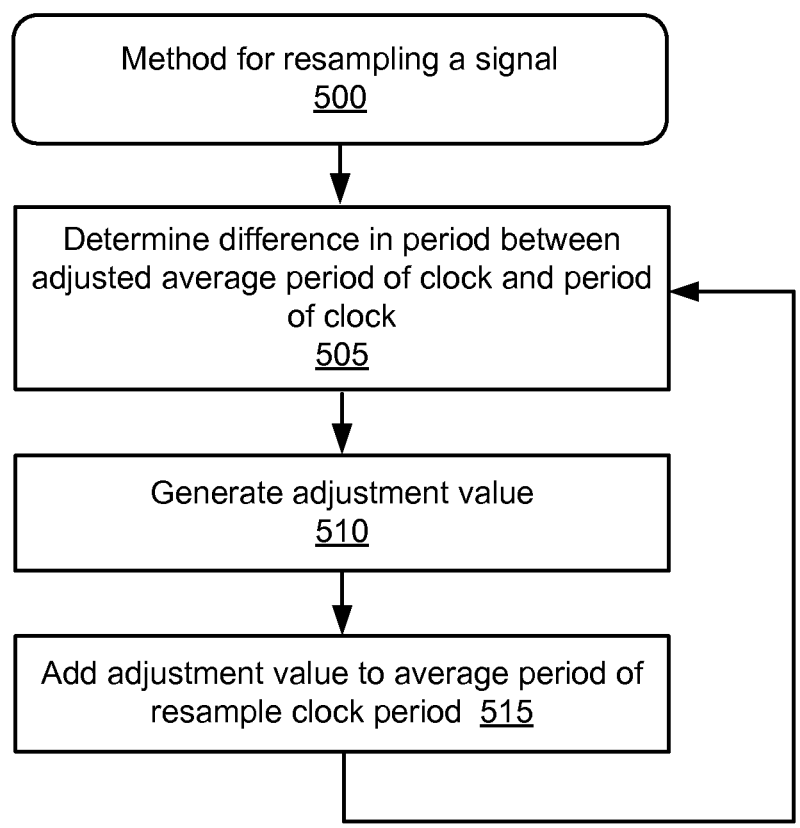
FIG. 5 is a flowchart illustrating a process flow for resampling a signal in accordance with some implementations.

FIG. 5 is a flowchart illustrating a process flow for resampling a signal in accordance with some implementations. In block 505, a difference in period between an adjusted average period of a resample clock and the resample clock may be determined. For example, period difference 270 may determine the difference between the adjusted average period of resample clock 130 and the period of resample clock 130. In block 510, an adjustment value may be generated. For example, a set of adjustment values may be generated by controller values 260. In block 515, an adjustment value may be summed with the average period of a resample clock. For example, the set of adjustment values may be summed with the average period of resample clock 130 by period adjustment 250. Method 500 returns to block 505 and repeats.

Figure 6:
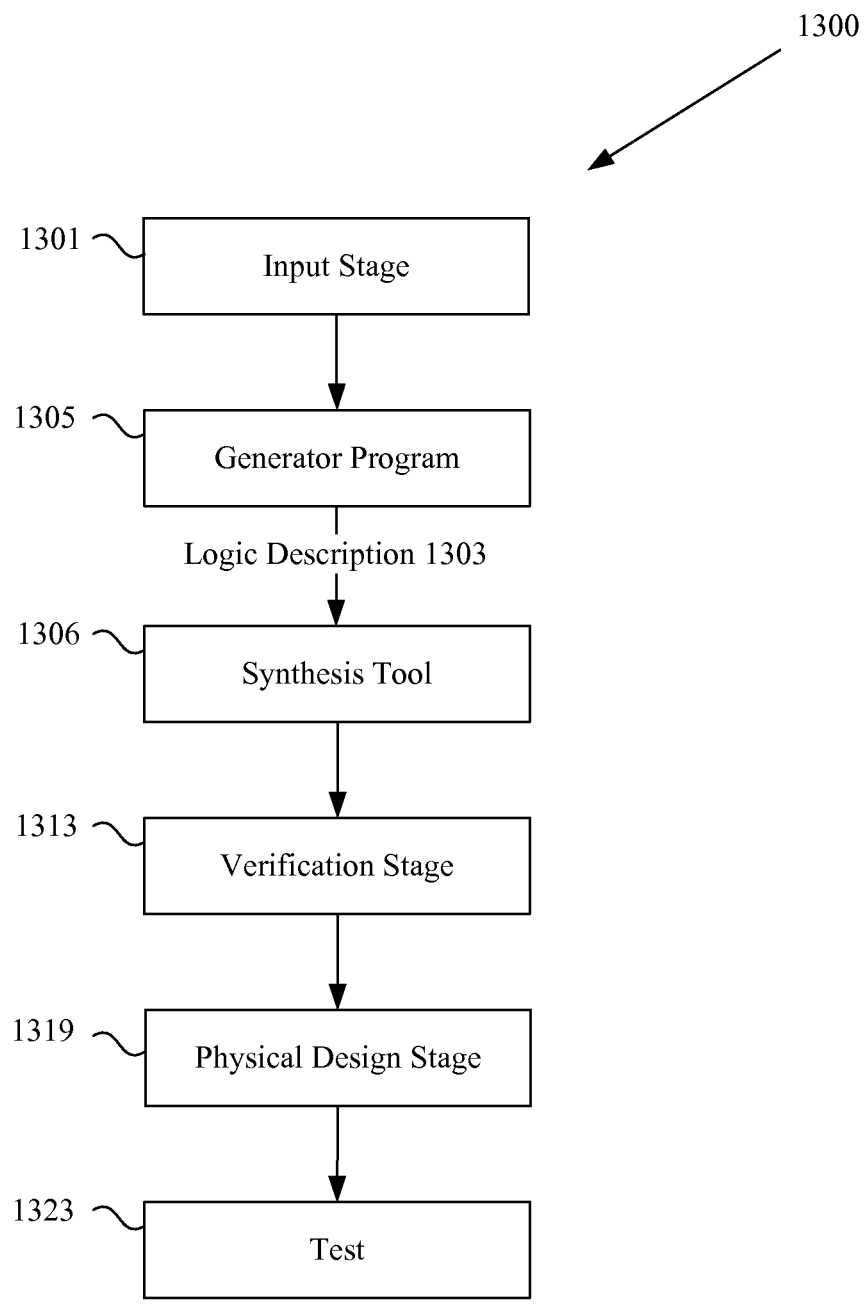
FIG. 6 illustrates a technique for implementing a programmable chip.

In some implementations, various components may be implemented in a programmable chip. FIG. 6 illustrates a technique for implementing a programmable chip. An input stage 1301 receives selection information typically from a user for logic such as a processor core as well as other components to be implemented on an electronic device. In one example, the input received is in the form of a high-level language program. A generator program 1305 creates a logic description and provides the logic description along with other customized logic to any of a variety of synthesis tools, place and route programs, and logic configuration tools to allow a logic description to be implemented on an electronic device.

In one example, an input stage 1301 often allows selection and parameterization of components to be used on an electronic device. The input stage 1301 also allows configuration of hard coded logic. In some examples, components provided to an input stage include intellectual property functions, megafunctions, and intellectual property cores. The input stage 1301 may be a graphical user interface using wizards for allowing efficient or convenient entry of information. The input stage may also be a text interface or a program reading a data file such as a spreadsheet, database table, or schematic to acquire selection information. The input stage 1301 produces an output containing information about the various modules selected. At this stage, the user may enter security information about individual components that needs to be isolated. For example, different levels of component security and which components are allowed to communicate with each other may be entered.

In typical implementations, the generator program 1305 can identify the selections and generate a logic description with information for implementing the various modules. The generator program 1305 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 1305 identifies pointers and provides ports for each pointer. One tool with generator program capabilities is System on a Programmable Chip (SOPC) Builder available from Altera Corporation of San Jose, Calif. The generator program 1305 also provides information to a synthesis tool 1307 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 1301, generator program 1305, and synthesis tool 1307 can be separate programs. The interface between the separate programs can be a database file, a log, or simply messages transmitted between the programs. For example, instead of writing a file to storage, the input stage 1301 can send messages directly to the generator program 1305 to allow the generator program to create a logic description. Similarly, the generator program can provide information directly to the synthesis tool instead of writing HDL files. Similarly, input stage 1301, generator program 1305, and synthesis tool 1307 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 1307.

A synthesis tool 1307 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 1313 typically follows the synthesis stage 1307. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 1313, the synthesized netlist file can be provided to physical design tools 1319 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 1323.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 1301, the generator program 1305, the synthesis tool 1307, the verification tools 1313, and physical design tools 1319 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 7:
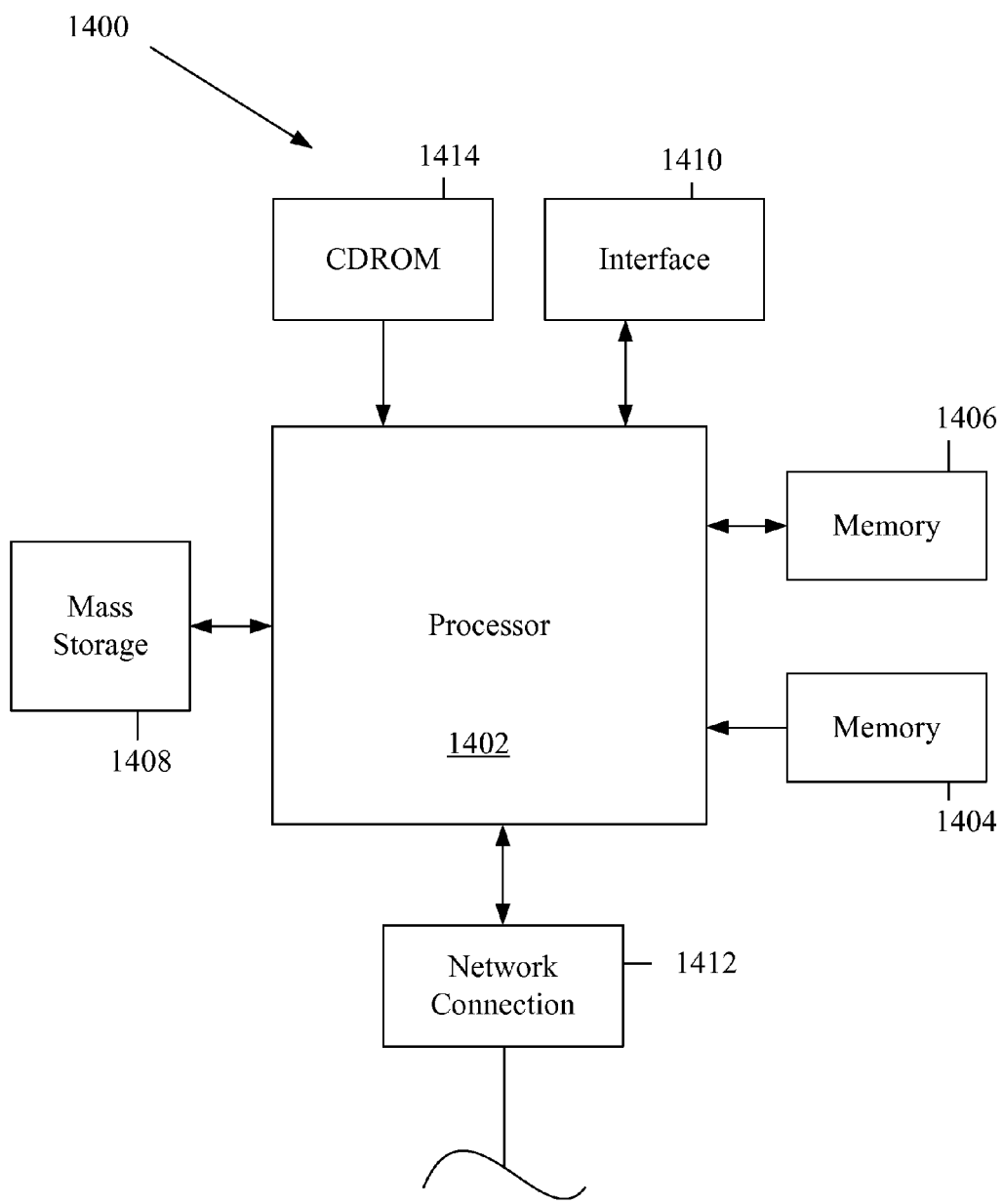
FIG. 7 illustrates one example of a computer system.

FIG. 7 illustrates one example of a computer system. The computer system 900 includes any number of processors 1402 (also referred to as central processing units, or CPUs) that are coupled to devices including memory 1406 (typically a random access memory, or "RAM"), memory 1404 (typically a read only memory, or "ROM"). The processors 1402 can be configured to generate an electronic design. As is well known in the art, memory 1404 acts to transfer data and instructions uni-directionally to the CPU and memory 1406 are used typically to transfer data and instructions in a bi-directional manner.

Both of these memory devices may include any suitable type of the computer-readable media described above. A mass storage device 1408 is also coupled bi-directionally to CPU 1402 and provides additional data storage capacity and may include any of the computer-readable media described above. The mass storage device 1408 may be used to store programs, data and the like and is typically a secondary storage medium such as a hard disk that is slower than memory. The mass storage device 1408 can be used to hold a library or database of prepackaged logic or intellectual property functions, as well as information on generating particular configurations. It will be appreciated that the information retained within the mass storage device 1408, may, in appropriate cases, be incorporated in standard fashion as part of memory 1406 as virtual memory. A specific mass storage device such as a CD-ROM 1414 may also pass data uni-directionally to the CPU.

CPU 1402 is also coupled to an interface 1410 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1402 may be a design tool processor. Finally, CPU 1402 optionally may be coupled to a computer or telecommunications network using a network connection as shown generally at 1412. With such a network connection, it is contemplated that the CPU might receive information from the network, or might output information to the network in the course of performing the above-described process steps. It should be noted that the system 1400 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A circuit comprising:
   a clock period measurement unit to determine a period of a clock signal;
   an average clock period calculation unit to determine an average period of the clock signal, the average period of the clock signal based on a plurality of measurements of the period of the clock signal;
   a period adjustment unit to generate an adjusted average period of the clock signal based on the average period of the clock signal and one or more adjustment values;
   a period difference unit to determine a difference of the adjusted average period of the clock signal and the period of the clock signal; and
   an adjustment values unit to generate the one or more adjustment values based on the difference of the adjusted average period of the clock signal and the period of the clock signal.

2. The circuit of claim 1, wherein the adjusted average period of the clock signal is based on a summation of the average period of the clock signal and the one or more adjustment values.

3. The circuit of claim 1, wherein the average period clock period calculation unit includes a first accumulator and a second accumulator.

4. The circuit of claim 3, wherein the first accumulator provides an average period of a first number of periods of the clock signal, and the second accumulator stage provides an average period of a second number of the average periods provided by the first accumulator.

5. The circuit of claim 4, wherein the second number is higher than the first number.

6. The circuit of claim 4, wherein the first accumulator generates an enable signal provided to the second accumulator, the second accumulator to store data corresponding with the average period of the of the first number of periods of the clock signal provided by the first accumulator based on the enable signal.

7. The circuit of claim 1, further comprising:
   a timing calculator unit for providing data for resampling an audio signal based on the adjusted average period of the clock signal.

8. A circuit comprising:
   an average clock period calculation unit to determine an average period of a clock signal, the average period of the clock signal based on a plurality of measurements of the period of the clock signal; and
   a clock control unit to determine a first adjusted average period of the clock signal based on the average period of the clock signal and the period of the clock signal, wherein the clock control unit generates a first adjustment value based on a difference in period of the first adjusted average period of the clock signal and the period of the clock signal.

9. The circuit of claim 8, further comprising:
   a timing calculator unit to provide data for resampling a signal based on the first adjusted average period of the clock signal.

10. The circuit of claim 8, wherein the clock control unit determines a second adjusted average period of the clock signal based on the average period of the clock signal and the first adjustment value.

11. The circuit of claim 10, wherein the second adjusted average period of the clock signal is based on a summation of the average period of the clock signal and the first adjustment value.

12. The circuit of claim 11, wherein the clock control unit determines a second adjustment value based on the second adjusted average period of the clock signal and the period of the clock signal.

13. The circuit of claim 12, wherein the clock control unit determines a third adjusted average period of the clock signal based on the average period of the clock signal, the first adjustment value, and the second adjustment value.

14. The circuit of claim 8, wherein the average period clock period calculation unit includes a first accumulator and a second accumulator.

15. The circuit of claim 14, wherein the first accumulator provides an average period of a first number of periods of the clock signal, and the second accumulator stage provides an average period of a second number of the average periods provided by the first accumulator.

16. The circuit of claim 15, wherein the second number is higher than the first number.

17. The circuit of claim 15, wherein the first accumulator generates an enable signal provided to the second accumulator, the second accumulator to store data corresponding with the average period of the of the first number of periods of the clock signal provided by the first accumulator based on the enable signal.

18. A method for resampling a signal, the method comprising:
   determining a difference in period between a first adjusted average period of a clock signal and a period of a clock signal;

generating an adjustment value based on the difference in period between the first adjusted average period of a clock signal and the period of a clock signal;
determining an average period of the clock signal; and
generating a second adjusted average period of a clock signal based on the adjustment value and the average period of the clock signal.

19. The method of claim 18, further comprising:
determining a difference in period between the second adjusted average period of the clock signal and the period of the clock signal; and
generating a second adjustment value based on the difference in period between the second adjusted average period of the clock signal and the period of the clock signal.

* * * * *